(12) United States Patent
Fu et al.

(10) Patent No.: US 9,741,418 B2
(45) Date of Patent: Aug. 22, 2017

(54) WRITE APPARATUS AND MAGNETIC MEMORY

(71) Applicant: Huawei Technologies Co., Ltd., Shenzhen (CN)

(72) Inventors: Yarong Fu, Shanghai (CN); Junfeng Zhao, Shenzhen (CN); Yuangang Wang, Shenzhen (CN); Wei Yang, Hangzhou (CN); Yinyin Lin, Shanghai (CN); Kai Yang, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 15/333,235

(22) Filed: Oct. 25, 2016

(65) Prior Publication Data
US 2017/0040046 A1 Feb. 9, 2017

Related U.S. Application Data

(63) Continuation of application No. PCT/CN2015/077219, filed on Apr. 22, 2015.

(30) Foreign Application Priority Data

Apr. 25, 2014 (CN) .......................... 2014 1 0173016

(51) Int. Cl.
*G11C 5/02* (2006.01)
*G11C 19/08* (2006.01)
(Continued)

(52) U.S. Cl.
CPC .......... *G11C 11/1675* (2013.01); *G11B 5/012* (2013.01); *G11B 5/653* (2013.01);
(Continued)

(58) Field of Classification Search
CPC . G11C 11/16; G11C 11/1675; G11C 19/0841; G11B 5/012; G11B 5/653; G11B 5/656
See application file for complete search history.

(56) References Cited

U.S. PATENT DOCUMENTS 6,639,830 B1* 10/2003 Heide ..................... G11C 11/16
365/158
2004/0252539 A1 12/2004 Parkin
(Continued)

FOREIGN PATENT DOCUMENTS

CN 1161531 A 10/1997
CN 101295508 A 10/2008
(Continued)

OTHER PUBLICATIONS

Venkatesan, R., et al., "DWM-Tapestri—An Energy Efficient All-Spin Cache using Domain wall Shift based Writes," Mar. 18, 2013, 6 pages.
(Continued)

*Primary Examiner* — Toan Le
(74) *Attorney, Agent, or Firm* — Conley Rose, P.C.

(57) ABSTRACT

A write apparatus and a magnetic memory, where the write apparatus includes a first drive port, a second drive port, a first information storage area, a second information storage area, and an information buffer. A first area locates between the first information storage area and the information buffer. A second area locates between the second information storage area and the information buffer. The first information storage area, the second information storage area, and the information buffer are made of a first magnetic material. The first area and the second area are made of a second magnetic material. Magnetic energy of the first magnetic material is
(Continued)

higher than magnetic energy of the second magnetic material. The write apparatus can ensure write stability of the magnetic memory.

19 Claims, 4 Drawing Sheets

(51) Int. Cl.
G11C 11/16 (2006.01)
G11B 5/65 (2006.01)
G11B 5/012 (2006.01)

(52) U.S. Cl.
CPC .............. *G11B 5/656* (2013.01); *G11C 11/16* (2013.01); *G11C 19/0841* (2013.01)

(56) References Cited

U.S. PATENT DOCUMENTS

| | | | |
|---|---|---|---|
| 2009/0052095 A1* | 2/2009 | Yamada | G11B 5/02 360/324 |
| 2009/0097365 A1 | 4/2009 | Lee et al. | |
| 2009/0296461 A1* | 12/2009 | Kang | G11C 11/16 365/171 |
| 2010/0238698 A1 | 9/2010 | Lim et al. | |
| 2011/0090730 A1 | 4/2011 | Tsai et al. | |
| 2012/0184445 A1* | 7/2012 | Mukhanov | G11C 11/44 505/171 |
| 2013/0250668 A1* | 9/2013 | Fukuzawa | G11C 11/161 365/158 |
| 2013/0329317 A1* | 12/2013 | Yamada | G11B 5/02 360/78.04 |
| 2015/0249207 A1 | 9/2015 | Uchida et al. | |

FOREIGN PATENT DOCUMENTS

| | | |
|---|---|---|
| CN | 101373597 A | 2/2009 |
| EP | 1918936 A1 | 5/2008 |
| EP | 1936633 A1 | 6/2008 |
| WO | 2014050380 A1 | 4/2014 |

OTHER PUBLICATIONS

Foreign Communication From A Counterpart Application, European Application No. 15783125.6, Extended European Search Report dated Mar. 13, 2017, 10 pages.

Foreign Communication From A Counterpart Application, PCT Application No. PCT/CN2015/077219, English Translation of International Search Report dated Jul. 29, 2015, 2 pages.

Foreign Communication From A Counterpart Application, PCT Application No. PCT/CN2015/077219, English Translation of Written Opinion dated Jul. 29, 2015, 5 pages.

\* cited by examiner

WRITE APPARATUS AND MAGNETIC MEMORY

CROSS-REFERENCE TO RELATED APPLICATIONS

This application is a continuation of International Application No. PCT/CN2015/077219, filed on Apr. 22, 2015, which claims priority to Chinese Patent Application No. 201410173016.2, filed on Apr. 25, 2014. The disclosures of the aforementioned applications are hereby incorporated by reference in their entireties.

TECHNICAL FIELD

Embodiments of the present disclosure relate to storage technologies, and in particular, to a write apparatus and a magnetic memory.

BACKGROUND

Magnetic domains refer to small differentiated magnetized areas in different directions that are produced in a spontaneous magnetization process of a magnetic material to reduce magnetostatic energy. These areas all include a large quantity of atoms, and magnetic moments of these atoms are uniformly aligned like a lot of small magnets. Because the atom magnetic moments in different adjacent areas are aligned in different directions, a magnetic domain wall is formed at a boundary between magnetic domains. A magnetic memory is a storage device for recording information by pushing a position at which the magnetic domain wall is located using a current or a magnetic field that is produced by a power supply and that is exerted on the magnetic material, to push an aligning direction of an atom magnetic moment to a magnetic domain to which the information is to be written. The aligning direction of the atom magnetic moment is related to an electron spin direction in the atom magnetic moment, and the atom magnetic moment is a vector sum of an orbit magnetic moment, a spin magnetic moment, and a nuclear magnetic moment that are of all electron sets in the atom magnetic moment.

In recent years, related theories and experiments of performing writing by pushing a magnetic domain wall using a power supply are progressively put forward and well developed, a storage speed of the magnetic memory exceeds storage speeds of a conventional flash memory chip and hard disk, and the magnetic memory receives wide attention in the market. However, in the prior art, because a magnetic domain wall cannot be fastened at a position and easily moves when driven by a power supply, data written to a magnetic domain cannot be stably pinned in the magnetic domain when driven by a power supply, and probably moves to another magnetic domain. Once the data moves to another magnetic domain whose direction is reverse to an electron spin direction of the data, data that is already written to the another magnetic domain is canceled, limiting write stability.

SUMMARY

Embodiments of the present disclosure provide a write apparatus and a magnetic memory, which can ensure write operation stability of a magnetic memory.

According to a first aspect, an embodiment of the present disclosure provides a write apparatus, where the write apparatus is configured to perform a write operation for a magnetic memory that stores information using a magnetic domain, and includes a first drive port, a second drive port, a first information storage area, a second information storage area, and an information buffer, where one end of the first drive port is connected to the first information storage area, and the other end of the first drive port is configured to connect to a power supply. One end of the second drive port is connected to the second information storage area, and the other end of the second drive port is configured to connect to the power supply. A first area locates between the first information storage area and the information buffer, a second area locates between the second information storage area and the information buffer. The first information storage area, the second information storage area, and the information buffer are made of a first magnetic material, and the first area and the second area are made of a second magnetic material, where the first magnetic material is different from the second magnetic material, and magnetic energy of the first magnetic material is higher than magnetic energy of the second magnetic material. The first information storage area is configured to write first data to the information buffer when the first drive port is driven by the power supply, where the first data is represented by an electron set having a first spin direction. The second information storage area is configured to write second data to the information buffer when the second drive port is driven by the power supply, where the second data is represented by an electron set having a second spin direction, and the first spin direction is reverse to the second spin direction, and the information buffer is configured to buffer data written from the first information storage area or the second information storage area, where the buffered data is written to a magnetic domain of the magnetic memory.

With reference to the first aspect, in a first possible implementation manner, the first magnetic material is at least one of iron, cobalt, or nickel, and the second magnetic material is at least one of iron, cobalt, or nickel.

According to a second aspect, an embodiment of the present disclosure provides a magnetic memory, including a magnetic storage orbit, a power supply, and the foregoing write apparatus, where the magnetic storage orbit includes multiple magnetic domains, where the magnetic domains are configured to record data written by the write apparatus, and the power supply is separately connected to the write apparatus and the magnetic storage orbit, and is configured to perform drive control on the magnetic storage orbit and the write apparatus, where an information buffer of the write apparatus has a size same as that of a magnetic domain in the magnetic storage orbit, the information buffer of the write apparatus is disposed between two adjacent magnetic domain walls of the magnetic storage orbit, a data write direction of the information buffer perpendicularly fits a magnetic domain movement direction of the magnetic storage orbit, and the write apparatus is configured to write data in the information buffer to a magnetic domain of the magnetic storage orbit.

With reference to the second aspect, in a first possible implementation manner, the magnetic storage orbit is a U-shaped orbit, and the information buffer of the write apparatus is disposed between two adjacent magnetic domain walls of a bottom orbit of the magnetic storage orbit, where each of the magnetic domain walls is configured to separate two adjacent magnetic domains.

With reference to the first possible implementation manner of the second aspect, in a second possible implementation manner, that a data write direction of the information buffer perpendicularly fits a magnetic domain movement direction of the magnetic storage orbit includes the data write direction of the information buffer of the write apparatus is a Y-axis direction if the magnetic domain movement direction of the magnetic storage orbit is an X-axis direction, where the X-axis and Y-axis are perpendicular to each other in a horizontal direction.

With reference to the first possible implementation manner of the second aspect, in a third possible implementation manner, that a data write direction of the information buffer perpendicularly fits a magnetic domain movement direction of the magnetic storage orbit includes the data write direction of the information buffer of the write apparatus is a Z-axis direction if the magnetic domain movement direction of the magnetic storage orbit is an X-axis direction, where the X-axis and Z-axis are perpendicular to each other in a vertical direction.

According to the write apparatus and the magnetic memory provided in the embodiments of the present disclosure, a first information storage area, a second information storage area, and an information buffer that are of the write apparatus are made of a first magnetic material, a first area between the first information storage area and the information buffer and a second area between the second information storage area and the information buffer are made of a second magnetic material, and magnetic energy of the first magnetic material is higher than magnetic energy of the second magnetic material such that a first magnetic domain wall between the first information storage area and the information buffer can be stably pinned in the first area in which magnetic energy is relatively low, and a second magnetic domain wall between the information buffer and the second information storage area is also stably pinned in the second area in which magnetic energy is relatively low. Because both the first magnetic domain wall and the second magnetic domain wall are pinned in the areas in which magnetic energy is relatively low, the first magnetic domain wall and the second magnetic domain wall cannot freely move. When driven by a power supply, first data or second data that is written to a magnetic domain by means of the information buffer can still be stably pinned in the magnetic domain, does not move to another magnetic domain, and does not cancel data that is already written to the other magnetic domain, thereby ensuring write stability.

BRIEF DESCRIPTION OF DRAWINGS

To describe the technical solutions in the embodiments of the present disclosure more clearly, the following briefly describes the accompanying drawings required for describing the embodiments. The accompanying drawings in the following description show drawings of some embodiments of the present disclosure.

DESCRIPTION OF EMBODIMENTS

To make the objectives, technical solutions, and advantages of the embodiments of the present disclosure clearer, the following clearly describes the technical solutions in the embodiments of the present disclosure with reference to the accompanying drawings in the embodiments of the present disclosure. The described embodiments are some but not all of the embodiments of the present disclosure.

It should be noted that, a write apparatus is an apparatus configured to write information for a magnetic memory. The write apparatus should include an information storage area for storing to-be-written information and an information buffer that buffers the to-be-written information and that writes the information to the magnetic memory, where the information buffer should have a same size as that of a magnetic domain of a magnetic storage orbit. Electrons in the information storage area of the write apparatus may be pushed to the information buffer when the write apparatus and the magnetic storage orbit are driven by a power supply. Because atom magnetic moments are aligned like a lot of small magnets and atoms have a particular spin direction, and an atom magnetic moment is a vector sum of an orbit magnetic moment, a spin magnetic moment, and a nuclear magnetic moment that are of all electron sets in the atom magnetic moment, data information of a spin direction of the electron sets is recorded in the information storage area, for example, a positive direction of an X-axis, which is equivalent to that 1 is recorded, and a negative direction of the X-axis is equivalent to that 0 is recorded. Then the data in the information buffer is written to a magnetic domain of the magnetic storage orbit, thereby completing writing to the magnetic memory.

Figure 1:
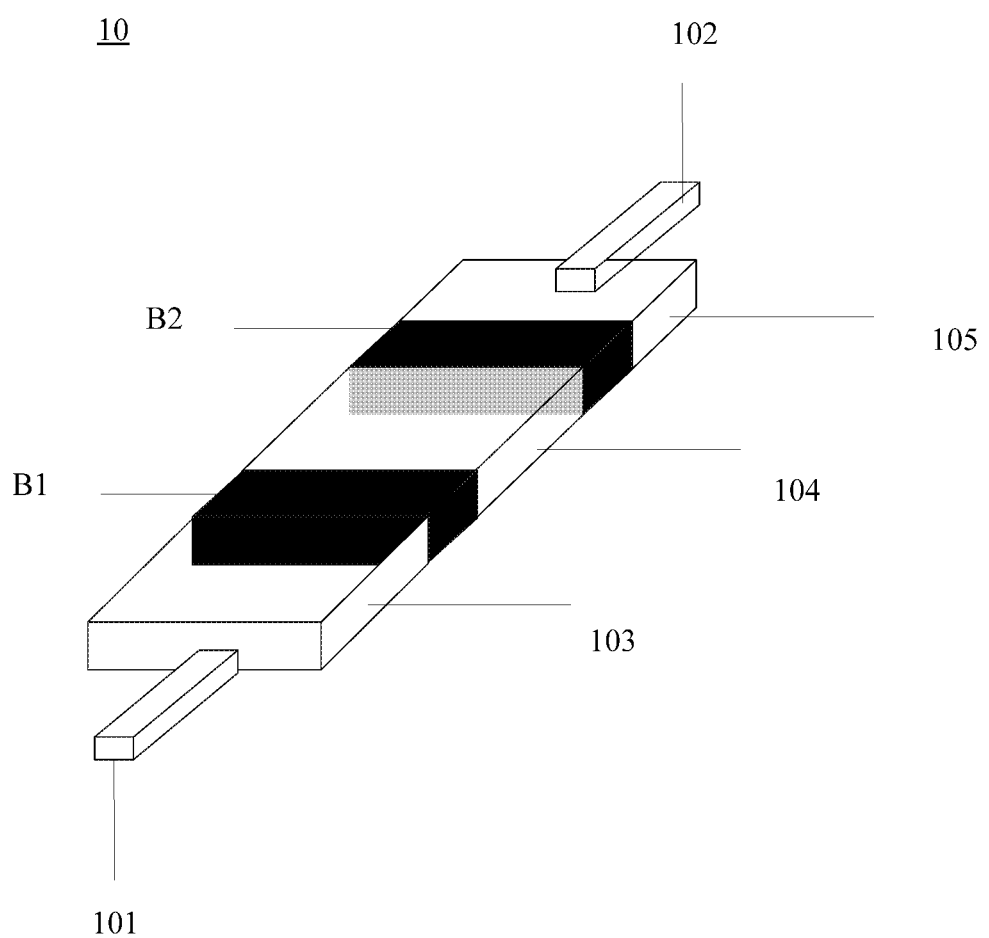
FIG. 1 is a schematic structural diagram of a write apparatus according to an embodiment of the present disclosure.

FIG. 1 is a schematic structural diagram of a write apparatus according to an embodiment of the present disclosure. As shown in FIG. 1, a write apparatus 10 includes a first drive port 101, a second drive port 102, a first information storage area 103, an information buffer 104, and a second information storage area 105.

One end of the first drive port 101 is connected to the first information storage area 103, and the other end of the first drive port 101 is configured to connect to a power supply. One end of the second drive port 102 is connected to the second information storage area 105, and the other end of the second drive port 102 is configured to connect to the power supply.

There is a first area B1 between the first information storage area 103 and the information buffer 104, and there is a second area B2 between the second information storage area 105 and the information buffer 104. The first information storage area 103, the second information storage area 105, and the information buffer 104 are made of a first magnetic material, and the first area B1 and the second area B2 are made of a second magnetic material, where the first magnetic material is different from the second magnetic material, and magnetic energy of the first magnetic material is higher than magnetic energy of the second magnetic material.

It should be noted that a magnetic material may be at least one of iron, cobalt, or nickel; for example, may be iron, cobalt, or nickel, or may be an alloy of cobalt and nickel, an alloy of iron, cobalt, and nickel, or the like. Further, the first magnetic material may be at least one of iron, cobalt, or nickel, and the second magnetic material may also be at least one of iron, cobalt, or nickel. However, the first magnetic material and the second magnetic material are different magnetic materials, and the magnetic energy of the first magnetic material needs to be higher than the magnetic energy of the second magnetic material.

The first information storage area 103 is configured to write first data to the information buffer 104 when the first drive port 101 is driven by the power supply, where the first data is represented by an electron set having a first spin direction.

Further, when the first drive port 101 is driven by the power supply, as driven by current pulses provided by the power supply, the first information storage area 103 has an electron set having a first spin direction, and because an electron set in the information buffer 104 has different spin directions, the first information storage area 103 acts on the information buffer 104 such that the directions of the electron set in the information buffer 104 all become the first spin direction. In this embodiment of the present disclosure, the first spin direction may be used to represent the first data, for example, the first data may be "0." According to this manner, the first data may be written to the information buffer 104.

The second information storage area 105 is configured to write second data to the information buffer 104 when the second drive port 102 is driven by the power supply, where the second data is represented by an electron set having a second spin direction, and the spin direction is an aligning direction of an atom magnetic moment. The first spin direction is reverse to the second spin direction.

Further, when the second drive port 102 is driven by the power supply, as driven by current pulses provided by the power supply, the second information storage area 105 has an electron set having a second spin direction, and because an electron set in the information buffer 104 has different spin directions, the second information storage area 105 acts on the information buffer 104 such that the directions of the electron set in the information buffer 104 all become the second spin direction. In this embodiment of the present disclosure, the second spin direction may be used to represent the second data, for example, the second data may be "1." According to this manner, the second data may be written to the information buffer 104.

It should be noted that values of the first data and the second data are not limited in this embodiment of the present disclosure, the first data may be "1," or the second data may be "0," as long as the first data and the second data are different.

It may be understood that, the power supply may drive the first information storage area 103 to write the first data to the information buffer 104 when the first data needs to be written. The power supply may drive the second information storage area 105 to write the second data to the information buffer 104 when the second data needs to be written.

The information buffer 104 is configured to buffer data written from the first information storage area 103 or the second information storage area 105, and write the buffered data to a magnetic domain of the magnetic memory.

It should be noted that, information that can be buffered in the information buffer 104 has a size same as that of information that can be written to a magnetic domain of the magnetic memory, for example, a buffering size of the information buffer 104 is 10 megabytes (MB), and a size of information that can be written to a magnetic domain of the magnetic memory is also 10 MB.

In this embodiment of the present disclosure, when driven by the power supply, a magnetic domain in the magnetic storage orbit may move to a position coinciding with the information buffer 104. After the first information storage area 103 or the second information storage area 105 writes data to the information buffer 104 when driven by the power supply, the write apparatus may continue to push the data to a magnetic domain, coinciding with the information buffer 104, of the magnetic memory when driven by the power supply. After the data is written to the magnetic domain, the magnetic domain continues to move forward when driven by pulses of the power supply. According to this manner, subsequent magnetic domains are sequentially pushed to the position coinciding with the information buffer 104, and the write apparatus sequentially writes different data to different magnetic domains of the magnetic memory.

Further, the first spin direction is reverse to the second spin direction, for example, if the first spin direction is a positive direction of an X-axis in a horizontal direction, the second spin direction is a negative direction of the X-axis, or if the first spin direction is a positive direction of a Y-axis in a horizontal direction, the second spin direction is a negative direction of the Y-axis, or if the first spin direction is a positive direction of a Z-axis in a vertical direction, the second spin direction is a negative direction of the Z-axis. The X-axis and the Y-axis are axes perpendicular to each other in the horizontal direction, and the X-axis and the Z-axis are axes perpendicular to each other in the vertical direction. In this embodiment of the present disclosure, the positive direction of the X-axis may be identified as M1, the negative direction of the X-axis is identified as M2, the positive direction of the Y-axis is identified as M3, the negative direction of the Y-axis is identified as M4, the positive direction of the Z-axis is identified as M5, and the negative direction of the Z-axis is identified as M6.

The first spin direction of the write apparatus 10 provided in this embodiment of the present disclosure may vary, for example, the first spin direction of the write apparatus 10 may be M1, and the second spin direction of the write apparatus 10 is M2, or the first spin direction of the write apparatus 10 may be M4, and the second spin direction is M3, or the first spin direction of the write apparatus 10 may be M5, and the second spin direction is M6.

Further, an angle between the information buffer 104 and the first information storage area 103 may be an obtuse angle, a straight angle, or an acute angle, and an angle between the information buffer 104 and the second information storage area 105 may be an obtuse angle, a straight angle, or an acute angle. The angles are not limited to a straight angle shown in FIG. 1.

According to the write apparatus provided in this embodiment of the present disclosure, because a first magnetic material is different from a second magnetic material, and magnetic energy of the first magnetic material is higher than magnetic energy of the second magnetic material, a magnetic domain wall between a first information storage area 103 and an information buffer 104 is located at a position with relatively low magnetic energy, that is, a first area B1, a magnetic domain wall between a second information storage area 105 and the information buffer 104 is located at a position with relatively low magnetic energy, that is, a second area B2, and when driven by a power supply, first data or second data that is written by means of the information buffer 104 can still be stably pinned in a current magnetic domain of the information buffer 104, does not move to another magnetic domain, and does not cancel data that is already written to the other magnetic domain, thereby ensuring write stability.

Figure 2:
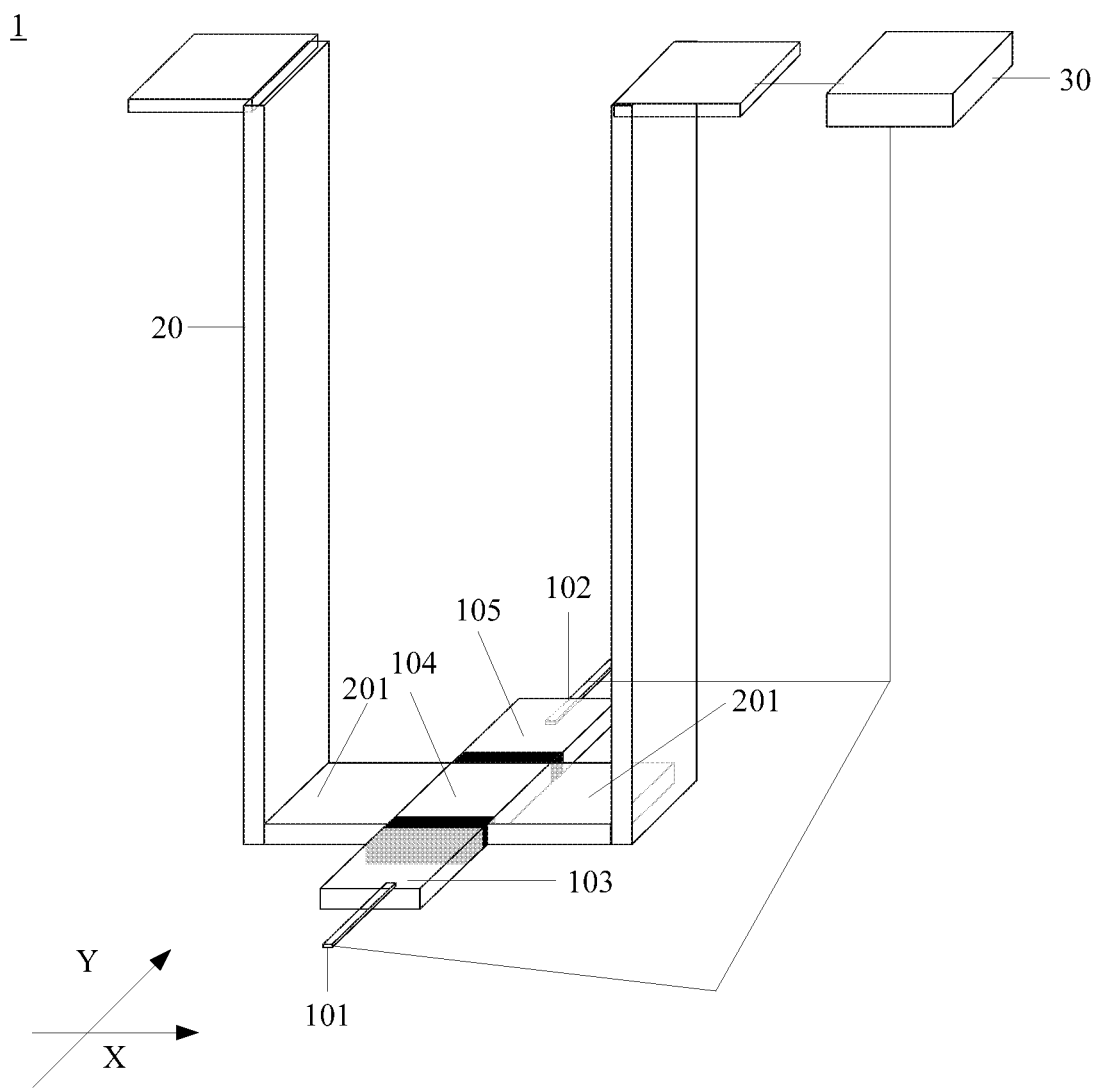
FIG. 2 is a schematic structural diagram of a magnetic memory according to an embodiment of the present disclosure.

FIG. 2 is a schematic structural diagram of a magnetic memory according to an embodiment of the present disclosure. As shown in FIG. 2, a magnetic memory 1 includes the write apparatus 10 provided in FIG. 1, a magnetic storage orbit 20, and a power supply 30, where a structure of the write apparatus 10 is described in the foregoing embodiment, and is not described herein again.

It should be noted that, the magnetic storage orbit 20 of the magnetic memory 1 provided in this embodiment of the present disclosure is a movable orbit that can be used to store information. The magnetic storage orbit 20 includes multiple magnetic domains 201, where the magnetic domains 201 are configured to record data written by the write apparatus 10. The magnetic domains 201 may be used to record data in a static initial state, and may move along the magnetic storage orbit 20 under the action of the power supply. For example, when driven by the power supply 30, storage in the magnetic storage orbit 20 sequentially shifts to the right, that is, after a magnetic domain 201 in the magnetic storage orbit 20 is fully filled by an information buffer 104 of the write apparatus 10, under the action of the power supply 30, the magnetic domain 201 moves to a right adjacent position along the magnetic storage orbit 20, and a magnetic domain at a left adjacent position simultaneously moves, under the action of the power supply 30, along the magnetic storage orbit 20 to a position to which data may be written by the information buffer 104, and so on.

The power supply 30 is separately connected to the write apparatus 10 and the magnetic storage orbit 20, and is configured to perform drive control on the magnetic storage orbit 20 and the write apparatus 10.

Further, one power supply 30 may be used to perform drive control on the magnetic storage orbit 20, and another power supply 30 is used to perform drive control on the write apparatus 10. Alternatively, only one power supply 30 may be disposed, and the power supply 30 is connected to the magnetic storage orbit 20, a first drive port 101 of the write apparatus 10, and a second drive port 102 of the write apparatus 10. In this way, the power supply 30 may be used to perform drive control on the magnetic storage orbit 20, perform drive control on a first information storage area 103 of the write apparatus 10, and also perform drive control on a second information storage area 105 of the write apparatus 10, thereby saving a power supply 30.

The information buffer 104 of the write apparatus 10 has a size same as that of a magnetic domain 201 in the magnetic storage orbit 20, the information buffer 104 of the write apparatus 10 is disposed between two adjacent magnetic domain walls of the magnetic storage orbit 20, a data write direction of the information buffer 104 (a Y direction shown in FIG. 2) perpendicularly fits a movement direction of the magnetic domains 201 (an X direction shown in FIG. 2) of the magnetic storage orbit 20, and the write apparatus 20 is configured to write data in the information buffer 104 to a magnetic domain 201 of the magnetic storage orbit 20.

Further, the magnetic storage orbit 20 may be a U-shaped orbit, the U-shaped orbit is only used as an example for description in this embodiment, and does not constitute any limitation, and another shape, for example, a linear orbit shall fall within the protection scope.

The information buffer 104 of the write apparatus 10 is disposed between two adjacent magnetic domain walls at the bottom of the magnetic storage orbit 20, where each of the magnetic domain walls is configured to separate two adjacent magnetic domains. Each magnetic domain wall moves along the magnetic storage orbit 20 under the action of the power supply, to push a target magnetic domain that is already fully filled out of a writing position of the information buffer 104, and push a next magnetic domain to which data is to be written to the writing position of the information buffer 104. A method for writing data to a magnetic domain 201 is same as a method for writing data to the information buffer 104 by the write apparatus 10.

For example, as shown in FIG. 2, if the movement direction of the magnetic domains 201 of the magnetic storage orbit 20 is the X-axis direction, the data write direction of the information buffer 104 of the write apparatus 10 is the Y-axis direction, where the X-axis and the Y-axis are axes perpendicular to each other in the horizontal direction, that is, when an angle between the first information storage area 103 and the information buffer 104 that are of the write apparatus 10 and an angle between the second information storage area 105 and the information buffer 104 that are of the write apparatus 10 are both straight angles, the write apparatus 10 is perpendicular to the bottom orbit along the horizontal direction.

Figure 3:
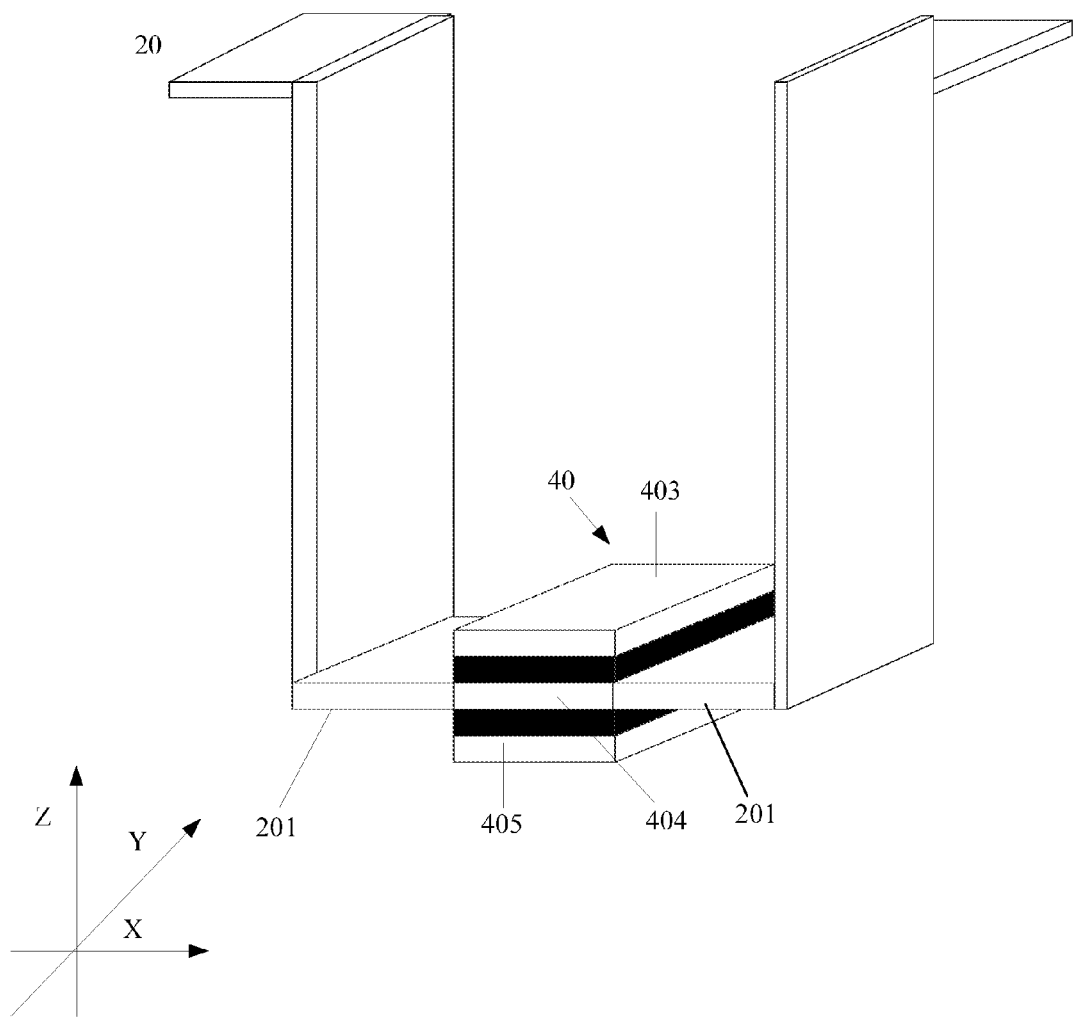
FIG. 3 is a schematic structural diagram of another magnetic memory according to an embodiment of the present disclosure.

FIG. 3 is a schematic structural diagram of another magnetic memory 1 according to an embodiment of the present disclosure. Different from FIG. 2, in FIG. 3, positions, relative to the magnetic storage orbit 20, of a first information storage area 403 and a second information storage area 405 that are of a write apparatus 40 are different. As shown in FIG. 3, if the movement direction of the magnetic domains 201 of the magnetic storage orbit 20 is the X-axis direction, a data write direction of an information buffer 404 of the write apparatus 40 is a Z-axis direction, where the X-axis and the Z-axis are axes perpendicular to each other in a vertical direction.

It should be noted that magnetic memories provided in FIG. 2 and FIG. 3 both use the write apparatus 10 provided in FIG. 1 for writing, and write stability can be improved.

Figure 4:
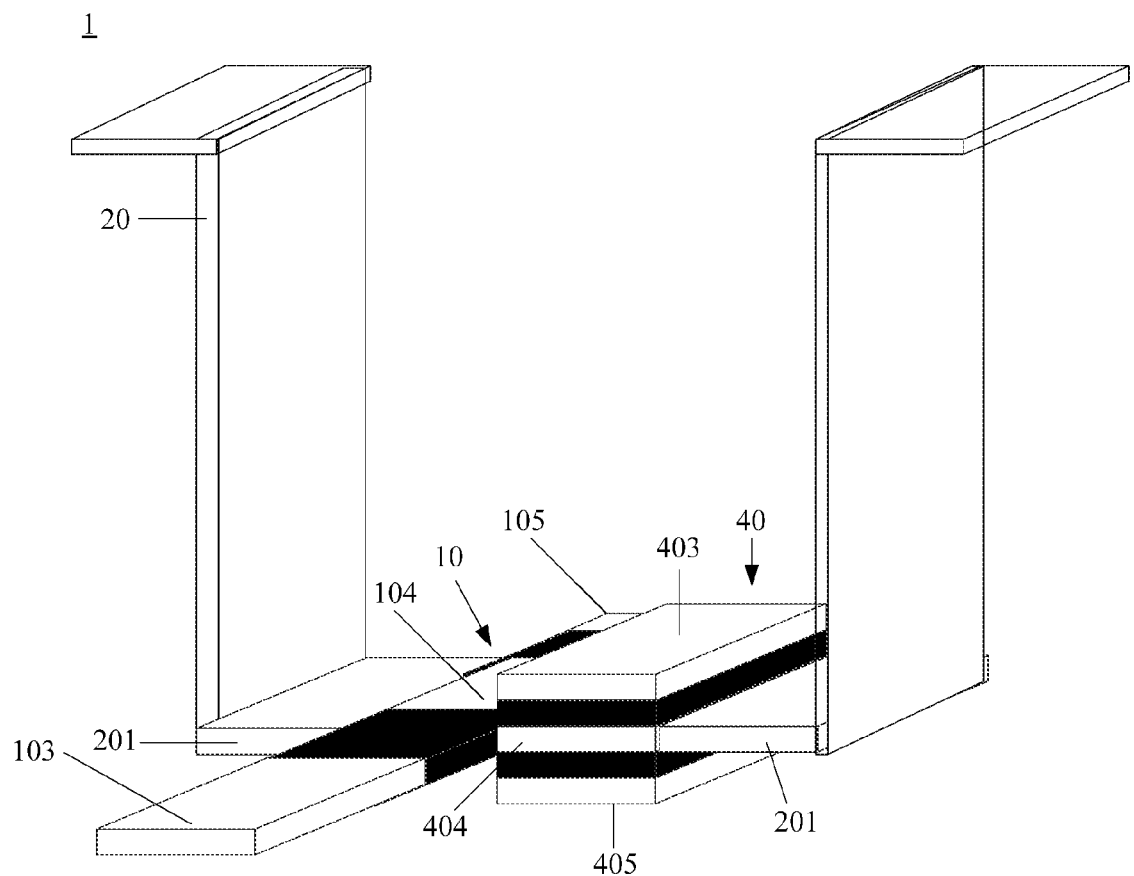
FIG. 4 is a schematic structural diagram of still another magnetic memory according to an embodiment of the present disclosure.

FIG. 4 is a schematic structural diagram of still another magnetic memory according to an embodiment of the present disclosure. As shown in FIG. 4, different from FIG. 2 and FIG. 3, a magnetic memory 1 includes write apparatuses provided in FIG. 2 and FIG. 3, respectively identified as a first write apparatus 10 and a second write apparatus 40. The first write apparatus 10 includes a first information storage area 103, an information buffer 104, and a second information storage area 105. The second write apparatus 40 includes a first information storage area 403, an information buffer 404, and a second information storage area 405. The first write apparatus 10 and the second write apparatus 40 are disposed in parallel along a direction of a magnetic storage orbit 20.

For example, the information buffer 104 of the first write apparatus 10 perpendicularly fits the magnetic storage orbit 20 in a horizontal direction, and the first write apparatus 10 is configured to write data from the information buffer 104 of the first write apparatus 10 to a magnetic domain 201 of the magnetic storage orbit 20.

It should be noted that, as shown in FIG. 4, the information buffer 104 of the write apparatus 10 is disposed between any two magnetic domain walls on a bottom orbit of the magnetic storage orbit 20, and the information buffer 404 of the write apparatus 40 is disposed at a position on the bottom orbit of the magnetic storage orbit 20 and adjacent to the information buffer 104. However, the position relationship in FIG. 4 is only used as an example, and another solution shall fall within the protection scope, for example, positions of the write apparatus 10 and the write apparatus 40 may be exchanged, or the information buffer 104 may be not disposed adjacent to the information buffer 404.

For example, the first write apparatus 10 and the second write apparatus 40 both may write data to magnetic domains in M1, M2, M3, M4, M5, and M6 directions, for example, when driven by the power supply, the first write apparatus 10 may write data parallel to an X-axis direction to the information buffer 104 in the bottom orbit of the magnetic storage orbit 20, that is, write first data in M1 direction or write second data in M2 direction, and at the same time, the write apparatus 40 may write data parallel to a Z-axis direction to the information buffer 404 in the bottom orbit of the magnetic storage orbit 20, that is, write first data in M5 direction or write second data in M6 direction. When driven by a next time of current pluses, an original target magnetic domain of the information buffer 104 moves to the information buffer 404 as a target magnetic domain, and data parallel to the Z-axis direction is written to the target magnetic domain. In this way, data parallel to the X-axis and the Z-axis may be written to the target magnetic domain, and a quantity of written data is increased.

It should be noted that the foregoing write directions are only used as an example for description, and another write direction shall fall within the protection scope.

Further, when the magnetic memory 1 includes three or more write apparatuses, each information buffer of the write apparatuses may be disposed between any two magnetic domain walls on the magnetic storage orbit 20, and may be adjacently disposed or may be not adjacently disposed, which is not described herein.

It should be noted that the magnetic memories provided in FIG. 3 and FIG. 4 both may be driven using one power supply, or using multiple power supplies, and no power supply is shown in FIG. 3 and FIG. 4.

According to the magnetic memory provided in the embodiments of the present disclosure, because the write apparatus provided in the embodiments is used, write operation stability of the magnetic memory can be ensured. In addition, if the magnetic memory in the embodiments uses two or more write apparatuses for writing, effective data writing may be ensured and data writing efficiency is also improved.

Persons of ordinary skill in the art may understand that all or some of the steps of the method embodiments may be implemented by a program instructing relevant hardware. The program may be stored in a computer-readable storage medium. When the program runs, the steps of the method embodiments are performed. The foregoing storage medium includes any medium that can store program code, such as a read-only memory (ROM), a random-access memory (RAM), a magnetic disk, or an optical disc.

Finally, it should be noted that the foregoing embodiments are merely intended for describing the technical solutions of the present disclosure, but not for limiting the present disclosure. Although the present disclosure is described in detail with reference to the foregoing embodiments, persons of ordinary skill in the art should understand that they may still make modifications to the technical solutions described in the foregoing embodiments or make equivalent replacements to some or all technical features thereof, without departing from the scope of the technical solutions of the embodiments of the present disclosure.

What is claimed is:

1. A write apparatus configured to perform a write operation for a magnetic memory that stores information using a magnetic domain, wherein the apparatus comprises:
   a first drive port;
   a second drive port;
   a first information storage area;
   a second information storage area; and
   an information buffer,
   wherein one end of the first drive port is connected to the first information storage area,
   wherein the other end of the first drive port is configured to connect to a power supply,
   wherein one end of the second drive port is connected to the second information storage area,
   wherein the other end of the second drive port is configured to connect to the power supply,
   wherein a first area locates between the first information storage area and the information buffer,
   wherein a second area locates between the second information storage area and the information buffer,
   wherein the first information storage area, the second information storage area, and the information buffer are made of a first magnetic material,
   wherein the first area and the second area are made of a second magnetic material,
   wherein the first magnetic material is different from the second magnetic material,
   wherein magnetic energy of the first magnetic material is higher than magnetic energy of the second magnetic material,
   wherein the first information storage area is configured to write first data to the information buffer when the first drive port is driven by the power supply,
   wherein the first data is represented by an electron set having a first spin direction,
   wherein the second information storage area is configured to write second data to the information buffer when the second drive port is driven by the power supply,
   wherein the second data is represented by an electron set having a second spin direction,
   wherein the first spin direction is reverse to the second spin direction,
   wherein the information buffer is configured to buffer data written from the first information storage area or the second information storage area, and
   wherein the buffered data is written to a magnetic domain of the magnetic memory.

2. The write apparatus according to claim 1, wherein the first magnetic material is at least one of iron, cobalt, or nickel, and wherein the second magnetic material is at least one of iron, cobalt, or nickel.

3. The write apparatus according to claim 1, wherein an angle between the information buffer and the first information storage area is an obtuse angle, a straight angle, or an acute angle, and wherein an angle between the information buffer and the second information storage area is an obtuse angle, a straight angle, or an acute angle.

4. A magnetic memory, comprising:
   a magnetic storage orbit, comprising multiple magnetic domains, wherein the multiple magnetic domains are configured to record data written by a first write apparatus,
   wherein the first write apparatus is configured to write data to the multiple magnetic domains of the magnetic storage orbit,
   wherein the first write apparatus, comprises:
   a first drive port;
   a second drive port;
   a first information storage area;
   a second information storage area; and
   an information buffer,
   wherein one end of the first drive port is connected to the first information storage area,
   wherein the other end of the first drive port is configured to connect to a power supply,
   wherein one end of the second drive port is connected to the second information storage area,
   wherein the other end of the second drive port is configured to connect to the power supply, wherein a first area locates between the first information storage area and the information buffer, wherein a second area locates between the second information storage area and the information buffer, wherein the first information storage area, the second information storage area, and the information buffer are made of a first magnetic material, wherein the first area and the second area are made of a second magnetic material, wherein the first magnetic material is different from the second magnetic material, and wherein magnetic energy of the first magnetic material is higher than magnetic energy of the second magnetic material.

5. The magnetic memory according to claim 4, wherein the first information storage area is configured to write first data to the information buffer when the first drive port is driven by the power supply, wherein the first data is represented by an electron set having a first spin direction, wherein the second information storage area is configured to write second data to the information buffer when the second drive port is driven by the power supply, wherein the second data is represented by an electron set having a second spin direction, wherein the first spin direction is reverse to the second spin direction, wherein the information buffer is configured to buffer data written from the first information storage area, and wherein the buffered data is written to the multiple magnetic domains of the magnetic storage orbit.

6. The magnetic memory according to claim 4, wherein the first information storage area is configured to write first data to the information buffer when the first drive port is driven by the power supply, wherein the first data is represented by an electron set having a first spin direction, wherein the second information storage area is configured to write second data to the information buffer when the second drive port is driven by the power supply, wherein the second data is represented by an electron set having a second spin direction, wherein the first spin direction is reverse to the second spin direction, wherein the information buffer is configured to buffer data written from the second information storage area, and wherein the buffered data is written to the multiple magnetic domains of the magnetic storage orbit.

7. The magnetic memory according to claim 4, wherein the information buffer of the first write apparatus has a size same as that of a magnetic domain in the magnetic storage orbit, wherein the information buffer of the first write apparatus is disposed between two adjacent magnetic domain walls of the magnetic storage orbit, and wherein a data write direction of the information buffer perpendicularly fits a magnetic domain movement direction of the magnetic storage orbit.

8. The magnetic memory according to claim 7, wherein the data write direction of the information buffer of the first write apparatus is a Y-axis direction when the magnetic domain movement direction of the magnetic storage orbit is an X-axis direction, and wherein the X-axis and the Y-axis are perpendicular to each other in a horizontal direction.

9. The magnetic memory according to claim 7, wherein the data write direction of the information buffer of the first write apparatus is a Z-axis direction when the magnetic domain movement direction of the magnetic storage orbit is an X-axis direction, and wherein the X-axis and the Z-axis are perpendicular to each other in a vertical direction.

10. The magnetic memory according to claim 4, wherein the magnetic storage orbit is a U-shaped orbit, wherein the information buffer of the first write apparatus is disposed between two adjacent magnetic domain walls of a bottom orbit of the magnetic storage orbit, and wherein each of the magnetic domain walls is configured to separate two adjacent magnetic domains.

11. The magnetic memory according to claim 4, further comprising a second write apparatus, wherein the first write apparatus and the second write apparatus are disposed in parallel along a direction of the magnetic storage orbit.

12. The magnetic memory according to claim 4, further comprising another power supply separately connecting to the first write apparatus and the magnetic storage orbit, wherein the other power supply is configured to perform drive control on the magnetic storage orbit and the first write apparatus.

13. The magnetic memory according to claim 4, wherein the first magnetic material is at least one of iron, cobalt, or nickel, and wherein the second magnetic material is at least one of iron, cobalt, or nickel.

14. The magnetic memory according to claim 4, wherein an angle between the information buffer and the first information storage area is an obtuse angle, a straight angle, or an acute angle, and wherein an angle between the information buffer and the second information storage area is an obtuse angle, a straight angle, or an acute angle.

15. A write apparatus configured to perform a write operation for a magnetic memory that stores information using a magnetic domain, wherein the apparatus comprises:
 a first drive port;
 a second drive port;
 a first information storage area;
 a second information storage area; and
 an information buffer,
 wherein one end of the first drive port is connected to the first information storage area,
 wherein the other end of the first drive port is configured to connect to a power supply,
 wherein one end of the second drive port is connected to the second information storage area,
 wherein the other end of the second drive port is configured to connect to the power supply,
 wherein a first area locates between the first information storage area and the information buffer,
 wherein a second area locates between the second information storage area and the information buffer,
 wherein the first information storage area, the second information storage area, and the information buffer are made of a first magnetic material,
 wherein the first area and the second area are made of a second magnetic material,
 wherein the first magnetic material is different from the second magnetic material, and
 wherein magnetic energy of the first magnetic material is higher than magnetic energy of the second magnetic material.

16. The write apparatus according to claim 15, wherein the first information storage area is configured to write first data to the information buffer when the first drive port is driven by the power supply, wherein the first data is represented by an electron set having a first spin direction, wherein the second information storage area is configured to write second data to the information buffer when the second drive port is driven by the power supply, wherein the second data is represented by an electron set having a second spin direction, wherein the first spin direction is reverse to the second spin direction, wherein the information buffer is configured to buffer data written from the first information storage area, and wherein the buffered data is written to a magnetic domain of the magnetic memory.

17. The write apparatus according to claim 16, wherein the first magnetic material is at least one of iron, cobalt, or nickel, and wherein the second magnetic material is at least one of iron, cobalt, or nickel.

18. The write apparatus according to claim 16, wherein an angle between the information buffer and the first information storage area is an obtuse angle, a straight angle, or an acute angle, and wherein an angle between the information buffer and the second information storage area is an obtuse angle, a straight angle, or an acute angle.

19. The write apparatus according to claim 15, wherein the first information storage area is configured to write first data to the information buffer when the first drive port is driven by the power supply, wherein the first data is represented by an electron set having a first spin direction, wherein the second information storage area is configured to write second data to the information buffer when the second drive port is driven by the power supply, wherein the second data is represented by an electron set having a second spin direction, wherein the first spin direction is reverse to the second spin direction, wherein the information buffer is configured to buffer data written from the second information storage area, and wherein the buffered data is written to a magnetic domain of the magnetic memory.

* * * * *